(12) United States Patent
Lu

(10) Patent No.: US 12,205,864 B2
(45) Date of Patent: Jan. 21, 2025

(54) THERMAL INTERFACE MATERIALS FOR THE INTERIOR, CENTER, AND EXTERIOR OF AN ELECTRONIC COMPONENT

(71) Applicant: G2F Tech Co., Ltd., Taoyuan (TW)

(72) Inventor: Jie-Qi Lu, Taoyuan (TW)

(73) Assignee: G2F TECH CO., LTD., Taoyuan (TW)

( * ) Notice: Subject to any disclaimer, the term of this patent is extended or adjusted under 35 U.S.C. 154(b) by 395 days.

(21) Appl. No.: 17/700,877

(22) Filed: Mar. 22, 2022

(65) Prior Publication Data

US 2023/0223313 A1 Jul. 13, 2023

(30) Foreign Application Priority Data

Jan. 13, 2022 (TW) .................................. 111101570

(51) Int. Cl.
*H01L 23/00* (2006.01)
*H01L 23/367* (2006.01)
*H01L 23/373* (2006.01)

(52) U.S. Cl.
CPC ...... *H01L 23/3672* (2013.01); *H01L 23/3731* (2013.01)

(58) Field of Classification Search
CPC . H01L 23/367; H01L 23/373; H01L 23/3672; H01L 23/3735; H01L 23/3736; H01L 23/3731; Y02D 10/00
See application file for complete search history.

(56) References Cited

U.S. PATENT DOCUMENTS

| | | | |
|---|---|---|---|
| 9,085,719 B2 | 7/2015 | Boday et al. | |
| 9,694,337 B2 | 7/2017 | Boday et al. | |
| 2019/0035712 A1* | 1/2019 | Kanaya | C08K 3/28 |
| 2019/0293370 A1* | 9/2019 | Liang | H01L 23/3672 |
| 2020/0224000 A1* | 7/2020 | Yamanari | C09J 7/38 |

FOREIGN PATENT DOCUMENTS

| | | | |
|---|---|---|---|
| CN | 103098575 A | | 5/2013 |
| CN | 106462204 B | | 8/2020 |
| JP | 2012211556 A | * | 11/2012 |
| JP | 2020098909 A | * | 6/2020 |
| TW | 200401805 A | | 2/2004 |
| TW | 201834960 | | 10/2018 |

* cited by examiner

Primary Examiner — Harry E Arant
(74) Attorney, Agent, or Firm — MUNCY, GEISSLER, OLDS & LOWE, P.C.

(57) ABSTRACT

The present invention provides thermal interface materials for the interior, center, and exterior of an electronic component, wherein the interior thereof is a first contact interface between an electronic chip and an integrated heat spreader; the center thereof is a second contact interface between the electronic chip and a heatsink; and the exterior thereof is a third contact interface between the integrated heat spreader and the heatsink. The thermal interface material consists of: a first, a second, a third thermal conductive adhesive layer, along with a thin electrically conductive functional layer. The thin electrically conductive functional layer is at least a conductive foil, a conductive foil with a ceramic and/or graphene heat dissipation layer on one side thereof, and a conductive foil with a ceramic and/or graphene heat dissipation layer on two sides thereof; and is laminated between the first and the second thermal conductive adhesive layer.

9 Claims, 7 Drawing Sheets

THERMAL INTERFACE MATERIALS FOR THE INTERIOR, CENTER, AND EXTERIOR OF AN ELECTRONIC COMPONENT

BACKGROUND OF THE INVENTION

(a) Field of the Invention

The present invention relates to the field of electronics, and more particularly to the application of thermal interface materials (TIMs) for the interior, center, and exterior of an electronic component. The interior of the electronic component is a first contact interface between an electronic chip and an integrated heat spreader (IHS); the center of the electronic component is a second contact interface between the electronic chips and a heatsink; and the exterior of the electronic component is a third contact interface between the integrated heat spreader and the heatsink. The first, second, and third thermal interface materials mounted to the interior, center, and exterior of the electronic component are abbreviated to TIM1, TIM1.5 and TIM2, respectively, according to their respective interior, center, and exterior application positions.

(b) Description of the Prior Art

Heat dissipation requirements of electronic component packaging is becoming increasingly stringent, thus, effective waste heat dissipation has become an even more important key factor to the development and design of electronic products. However, thermal conductivity design requires making allowances for maximizing the contact area of the thermal conductive interface, to enable the electronic component packaging surface to highly efficiently dissipate heat generated by the electronic component. As for thermal conductivity design for electronic component packaging of the prior art, thermal interface materials (TIMs) are still used to fill the gap between the electronic component packaging surface and a heat dissipation device surface. In generally, the TIM is manufactured from soft material, which is used to fill the gap between the electronic component packaging surface and a heat dissipation device, thereby increasing the effective contact area for thermal conductivity. The TIM is a heat conduction material used to fill the existing gaps on the interface and the gap between the two contact surfaces; however, air present in the gaps is a poor conductor of heat, thus, the high thermal conductive TIM is used to improve thermal conductivity efficiency of the contact interfaces. If a general thermal paste or pad with an average thermal conductivity K-value of 4~13 W/mK is used, the disadvantages include worry of leaking silicone oil, short serviceable life, and the need to break the device down to reconstruct. And if a conductive alloy paste or pad with an average thermal conductivity K-value of 13~21 W/mK or 60~80 W/mK is used, there is the apprehension over the need to be attached with heat, as well as current overflow and short circuit under high wattage, and thus needs enclosing.

Another type of thermal interface material commercially available is thermal graphite, which is an extremely thin, synthetically manufactured, highly directional graphite thin polymer film that is used for heat management and heat sink applications. Commercially available thermal graphite is particularly appropriate for application in restricted spaces or existing areas to provide supplementary heat dissipation. In addition to relying on their excellent thermal conductivity (2 to 4 times that of copper), thermal conductive graphite is provided with flexibility (able to withstand repeated bending), and can also be cut into custom made shapes, thus having application in electronic devices, including mobile phones and computers, semiconductor manufacturing equipment, and optical communication devices.

As for research in the prior art regarding single-layer carbon nanotube (CNT) composite materials for heat dissipation, Taiwan Patent No. TW201834960 discloses a single-layer CNT composite material and multilayer or multitiered structure and a single-layer CNT composite material formed from vertically aligned CNT arrays, and manufacturing method and application thereof. Such a multilayer or multitiered structure can be used as a thermal interface material (TIM) for a variety of applications, such as burn-in testing.

As for research in the prior art regarding thermal interface compounds, Taiwan Patent No. TW200401805A discloses a thermal interface compound comprising: a) at least two types of siloxane-based compounds, b) at least one type of inorganic micro-filler material, and c) at least one type of thermally conductive filler material. Further, the invention additionally discloses a method for forming the thermal interface material, wherein the method comprises: a) providing at least two types of siloxane-based compounds, b) providing at least one type of inorganic micro-filler material, c) providing at least one type of thermally conductive filler material, and d) combining the at least two types of siloxane-based compounds, the at least one type of inorganic micro-filler material, and the at least one type of thermally conductive filler material.

As for research in the prior art regarding reversibly adhesive thermal interface materials, U.S. Pat. No. 9,085,719B2 discloses a reversibly adhesive thermal interface material for electronic components and manufacturing method and application thereof, comprising a thermal interface material, containing a hydrolytically stable, thermal reversible adhesive, and a thermal conductive and electrically non-conductive filler, wherein the thermal conductivity of the thermal interface material is 0.2 W/m-K or more, and electrical resistivity is $9 \times 10^{11}$ ohm-cm or more. Moreover, the thermal reversible adhesive contains a functionalized aminopropyl methylsiloxane-dimethylsiloxane copolymer.

As for other research in the prior art regarding thermal interface materials containing microcapsules that rupture in a magnetic field, U.S. Pat. No. 9,694,337B2 discloses a thermal interface material (TIM) gap filler for filling a gap between two substrates, wherein microcapsules are distributed in the TIM gap filler, and each microcapsule has a shell that encapsulates a solvent. One or more organosilane-coated magnetic nanoparticles is/are covalently bonded into the shell of each microcapsule, In one embodiment, (3-aminopropyl) trimethylsilane-coated magnetite nanoparticles are incorporated into the shell of a urea-formaldehyde (UF) microcapsule during in situ polymerization. To enable easy removal of one substrate from another substrate that is affixed thereto using the TIM, the substrates are placed within a magnetic field sufficient to rupture the microcapsule shells through magnetic stimulation of the organosilane-coated magnetic nanoparticles. The ruptured microcapsule shells release the solvent therein, which dissolves and/or swells the TIM gap filler, thereby reducing the bond strength between the substrates.

As for research in the prior art regarding compact portable type electronic devices packaged into a system in package assembly and thermal solutions for the device, China Patent No. CN106462204B discloses a compact portable electronic device assembled into a single package to reduce size and improve the form factor thereof. Dozens or hundreds of components including a plurality of bare chips, passive components, and mechanical or optical components can be packaged into a single system on a printed circuit board. Because one or more of these components can consume a large amount of electric power, generating excess heat, the device includes one or a plurality of thermal solutions, such as internal thermal plugs, heat sinks, internal embedded cooling fins, and/or external cooling fins to remove the excessive heat. In the embodiments, the thermal solutions to dissipate the heat include conduction to the bottom portion of the substrate, convection to the top portion of the system, or a combination of both these methods.

As for research in the prior art regarding EMI (electromagnetic interference) shielded thermal interface assemblies, such as that disclosed in China Patent No. CN103098575A, in accordance with the various aspects disclosed in the specification, exemplary embodiments of a thermally conductive interface assembly for EMI (electromagnetic interference) shielding of the invention are disclosed, wherein the thermally conductive interface assembly for EMI shielding includes a thermal interface material and a shielding material, such as a conductive fabric, netting, or foil. The shielding material is embedded within the thermal interface material and/or sandwiched between a first thermal interface material layer and a second thermal interface material layer.

SUMMARY OF THE INVENTION

The inventor of the present invention has worked in the electronic material industry for many years, and is fully aware of the existing shortcomings of current commercially available thermal interface materials (TIMs) that need resolving, including poor reworkability, worry of leaking silicone oil, and short serviceable life. Furthermore, under conditions of high temperature or high wattage, there is the problem of current overflow, causing worries over electric conduction and short circuiting, and thus the need to enclose and isolate the thermal interface material to prevent current overflow. In order to resolve the current technical problems, the present invention provides thermal interface materials for the interior, center, and exterior of an electronic component, wherein the interior of the electronic component is a first contact interface between an electronic chip and an integrated heat spreader (IHS); the center of the electronic component is a second contact interface between the electronic chip and a heatsink; and the exterior of the electronic component is a third contact interface between the integrated heat spreader and the heatsink. The first, second, and third thermal interface materials mounted to the interior, center, and exterior of the electronic component are abbreviated to TIM1, TIM1.5, and TIM2, respectively, according to their respective interior, center, and exterior application positions. The thermal interface material comprises: a first thermal conductive adhesive layer, the thickness of which lies between 0.1 micrometers~300 micrometers, and has a voltage resistance of 100~20 KV; a second thermal conductive adhesive layer, the thickness of which lies between 0.1 micrometers~300 micrometers, and has a voltage resistance of 100~20 KV; and a thin electrically conductive functional layer. The thin electrically conductive functional layer is at least a conductive foil, a conductive foil provided with a ceramic and/or graphene heat dissipation layer on one side thereof, and a conductive foil provided with a ceramic and/or graphene heat dissipation layer on two sides thereof. Moreover, the thin electrically conductive functional layer is laminated between the first thermal conductive adhesive layer and the second thermal conductive adhesive layer, and has a voltage resistance of 500·20 KV. The conductive foil of the thin electrically conductive functional layer is at least a copper foil, an aluminum foil, silver paste, carbon nanotubes, electrically conductive macromolecules, tin paste, electrically conductive ink, or copper paste. The thickness of the conductive foil is 100 nanometers~50 millimeters, and the thickness of the ceramic and/or graphene heat dissipation layer is 20 nanometers~150 millimeters. A coating, printing, spraying, vapor deposition, or sputter coating method is used to cover the surfaces of the thin electrically conductive functional layer with the first thermal conductive adhesive layer and the second thermal conductive adhesive layer. The first thermal conductive adhesive layer and the second thermal conductive adhesive layer are thereby bonded onto the surfaces of the thin electrically conductive functional layer. The average thermal conductivity K-value of the first thermal conductive adhesive layer and the second thermal conductive adhesive layer (obtained from Hot Disc TPS (transient plane source) method test data) is between 30~150 W/mK, and the thermal diffusivity is between 10~130 mm$^2$/s. A coating, printing, spraying, vapor deposition, or sputter coating method is used to cover the surfaces of the conductive foil with the ceramic and/or graphene heat dissipation layer. 0.3~3 Kg/cm$^2$ low pressure bonding, 100~3 Kg/cm$^2$ high-pressure bonding, less than 0.1 mbar negative pressure and under 0.1~1 Kg/cm$^2$ pressure vacuum lamination, or a mixed roll/press bonding processing method is used to bond the TIM1 to the first contact interface between the electronic chip and the integrated heat spreader, with the TIM1 being at a temperature between –60~360° C. The first thermal conductive adhesive layer and the second thermal conductive adhesive layer of the TIM1.5 are sliding materials containing a lubricating oil and a hot melt adhesive. A low pressure or a mixed roll/press bonding processing method is used to bond the TIM1.5 to the second contact interface between the electronic chip and the heatsink, with the TIM1.5 being at a temperature between –60~360° C. The first thermal conductive adhesive layer and the second thermal conductive adhesive layer of the TIM2 are sliding materials containing a lubricating oil and a hot melt adhesive. 0.3~3 Kg/cm$^2$ low pressure bonding, or a mixed roll/press bonding processing method is used to bond the TIM2 to the third contact interface between the integrated heat spreader and the heatsink, with the TIM2 being at a temperature between –60~360° C.

The present invention is provided with good reworkability, will not leak silicone oil, a long operating life, highly tolerant under a high temperature and high wattage environment, no current overflow and short circuit, there is no need for it to be enclosed, and is appropriate for application in a variety of usage environments, which distinguish and differentiate it from the prior art. The originality, advancement, and practical effectiveness of the present invention are unmistakable. As for the technology and methods used by the present invention and effectiveness thereof, it is believed an in-depth understanding of the aforementioned objects, structure, and characteristics of present invention will be gained after reading the detailed description of the preferred embodiment modes of the present invention in conjunction with the diagrams.

To enable a further understanding of said objectives, structures, characteristics, and effects, as well as the technology and methods used in the present invention and effects achieved, a brief description of the drawings is provided below followed by a detailed description of the preferred embodiments.

DETAILED DESCRIPTION OF THE PREFERRED EMBODIMENTS

The following description uses specific concrete examples to describe the embodiment modes of the present invention. Persons skilled in the related art can easily deduce other advantages and effects of the present invention from the content disclosed in the specification. The present invention can also use other different concrete embodiments to clarify its performance and applications. Each detail described in the specification can also be based on a different perspective and application, enabling various types of modifications and alterations to be carried out without deviating from the spirit of the present invention.

Figure 1:
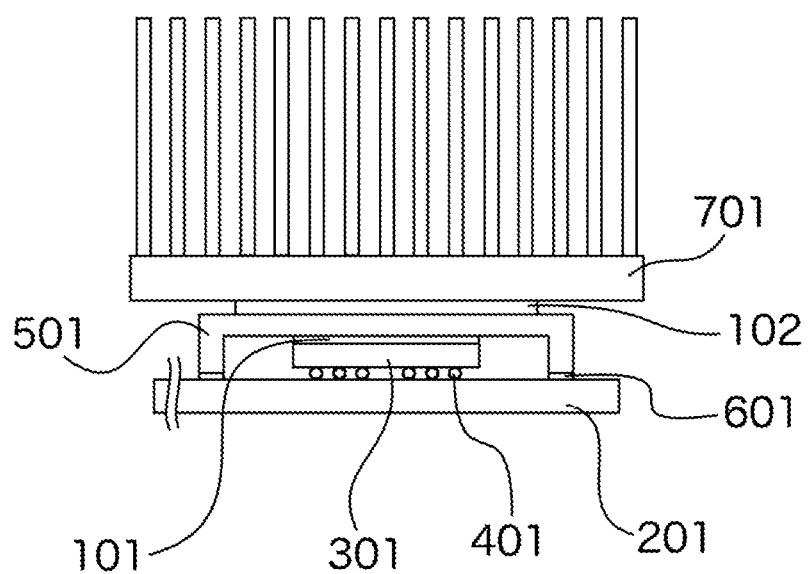
FIG. 1 is a configurational view showing application of thermal interface materials for the interior and exterior of an electronic component according to the present invention.

Referring first to FIG. 1, which shows a configurational view illustrating application of thermal interface materials for the interior and exterior of an electronic component according to the present invention, wherein an electronic chip 301 is mounted on a circuit substrate 201 and fixed thereto through a solder ball array 401. In order to dissipate the heat generated by the electronic chip 301 when powered on and operating, an integrated heat spreader (IHS) 501 is used to cover the surface of the electronic chip 301 to enable normal running and extend the serviceable life thereof. A solder tin alloy 601 is used to fix the integrated heat spreader 501 to the circuit substrate 201, and a thermal interface material (TIM1) 101 is used to fill the gap between the integrated heat spreader 501 and the electronic chip 301 of the interior of an electronic component, to increase thermal conductivity efficiency and achieve the effect to prevent electromagnetic interference. The object being to enable transferring and dissipating the heat generated by the electronic chip 301 to the integrated heat spreader 501. In order to further improve the heat dissipation effect, a heatsink 701 is also mounted on the surface of the integrated heat spreader 501, and a thermal interface material (TIM2) 102 is used to fill the gap between the integrated heat spreader 501 and the heatsink 701 of the exterior of an electronic component, to achieve the optimum heat dissipation effect for an electronic component. The thermal interface materials for the interior, center, and exterior of an electronic component provided by the present invention can be applied in the interior of an electronic component as a first contact interface between the electronic chip 301 and the integrated heat spreader 501, and as a third contact interface between the integrated heat spreader 501 and the heatsink 701 of the exterior of the electronic component, wherein the first and third contact interface are thermal interface materials mounted to the interior and exterior of two electronic components are respectively abbreviated to the TIM1 101 and the TIM2 102 according to the interior and exterior application positions thereof.

Figure 2:
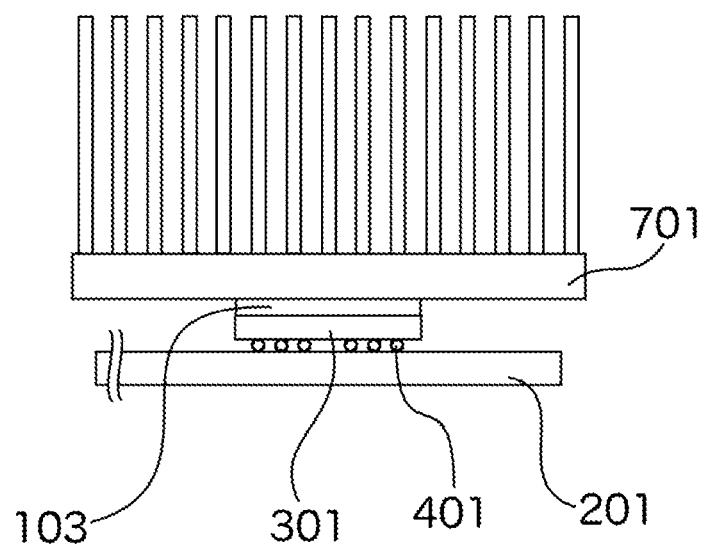
FIG. 2 is a configurational view showing application of the thermal interface materials for the center of an electronic component according to the present invention.

FIG. 2 shows a configurational view illustrating application of a thermal interface material for the center of an electronic component according to the present invention, wherein the electronic chip 301 is mounted on the circuit substrate 201 and fixed thereto through the solder ball array 401. Because the electronic chip 301 generates heat when powered on and operating, in practice, the size of the electronic chip 301 and space design of the electronic component are taken into consideration, thus, the integrated heat spreader can be eliminated and the heatsink 701 directly mounted on the surface of the electronic chip 301. A thermal interface material TIM1.5 103 is then used to fill the gap between the electronic chip 301 and the heatsink 701 at the center of an electronic component, to achieve the optimal heat dissipation effect for the electronic component in the given space. The thermal interface materials for the interior, center, and exterior of an electronic component provided by the present invention can be applied singularly as a second contact interface in the center of an electronic component between the electronic chip 301 and the heatsink 701, wherein the thermal interface material mounted to the center of the electronic component, is abbreviated to TIM1.5 103. In the description of the specification of the present invention, the interior, center, and exterior of an electronic component are defined according to the above described application positions of the thermal interface materials.

Figure 3:
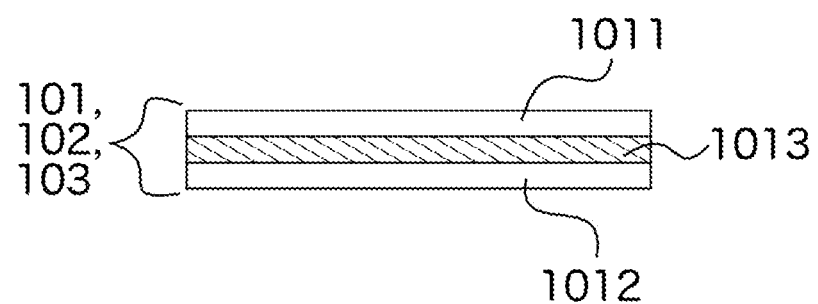
FIG. 3 shows a structural view of the thermal interface material for the interior, center, and exterior of an electronic component according to the present invention.

FIG. 3 shows a structural view of the thermal interface material for the interior, center, and exterior of an electronic component according to the present invention, wherein the thermal interface material comprises: a first thermal conductive adhesive layer 1011, the thickness of which lies between 0.1 micrometers~300 micrometers, and has a voltage resistance of 100~20 KV; a second thermal conductive adhesive layer 1012, the thickness of which lies between 0.1 micrometers~300 micrometers, and has a voltage resistance of 100~20 KV; and a thin electrically conductive functional layer 1013, which is sandwiched between the first thermal conductive adhesive layer 1011 and the second thermal conductive adhesive layer 1012, and has a voltage resistance of 500~20 KV. A coating, printing, spraying, vapor deposition, or sputter coating method is used to cover the two surfaces of the thin electrically conductive functional layer 1013 with the first thermal conductive adhesive layer 1011 and the second thermal conductive adhesive layer 1012, respectively, wherein the first thermal conductive adhesive layer 1011 and the second thermal conductive adhesive layer 1012 are adhesive bonded onto the surfaces of the thin electrically conductive functional layer 1013. Using the test standards of ISO 22007-2 transient plane heat source method (TPS), the average thermal conductivity K-value of the first thermal conductive adhesive layer 1011 and the second thermal conductive adhesive layer 1012 is between 30~150 W/mK, and the thermal diffusivity is between 10~130 mm²/s. The thermal interface materials for the interior, center, and exterior of an electronic component provided by the present invention, as shown in FIGS. 1 and 2, are respectively abbreviated to the TIM1 101, TIM1.5 103, and the TIM2 102 according to the interior, center, and exterior application positions thereof. 0.3~3 Kg/cm² low pressure bonding, 100~3 Kg/cm² high-pressure bonding, less than 0.1 mbar negative pressure and under 0.1~1 Kg/cm² pressure vacuum lamination, or a mixed roll/press bonding processing method is used to bond the TIM1 101 to the first contact interface between the electronic chip 301 and the integrated heat spreader 501, with the TIM1 101 being at a temperature between −60~360° C. The first thermal conductive adhesive layer 1011 and the second thermal conductive adhesive layer 1012 of the TIM1.5 103 are sliding materials containing a lubricating oil and a hot melt adhesive. A low pressure or a mixed roll/press bonding processing method is used to bond the TIM1.5 103 to the second contact interface between the electronic chip 301 and the heatsink 701, with the TIM1.5 103 being at a temperature between −60~360° C. The first thermal conductive adhesive layer 1011 and the second thermal conductive adhesive layer 1012 of the TIM2 102 are sliding materials containing a lubricating oil and a hot melt adhesive. 0.3~3 Kg/cm² low pressure bonding, or a mixed roll/press bonding processing method is used to bond the TIM2 102 to the third contact interface between the integrated heat spreader 501 and the heatsink 701, with the TIM2 102 being at a temperature between −60~360° C.

Figure 4:
FIG. 4 shows a structural view of an embodiment 1 of a thin electrically conductive functional layer of the thermal interface materials for the interior, center, and exterior of an electronic component according to the present invention.
Figure 5:
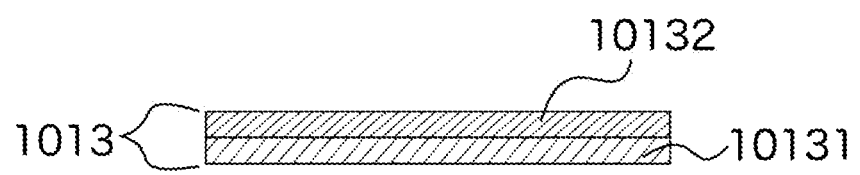
FIG. 5 shows a structural view of an embodiment 2 of the thin electrically conductive functional layer of the thermal interface materials for the interior, center, and exterior of an electronic component according to the present invention.

In order to enable the review committee to further understand applications of the present invention, FIG. 4 which shows a structural view of an embodiment 1 of a thin electrically conductive functional layer of the thermal interface materials for the interior, center, and exterior of an electronic component according to the present invention, wherein the thin electrically conductive functional layer 1013 is a conductive foil 10131. The conductive foil 10131 is at least copper foil, aluminum foil, silver paste, carbon nanotubes, electrically conductive macromolecules, tin paste, electrically conductive ink, or copper paste, and the thickness of the conductive foil 10131 is 100 nanometers~50 millimeters. FIG. 5 shows a structural view of an embodiment 2 of the thin electrically conductive functional layer of the thermal interface materials for the interior, center, and exterior of an electronic component according to the present invention, wherein the thin electrically conductive functional layer 1013 is the conductive foil 10131 provided with a ceramic and/or graphene heat dissipation layer 10132 on one side thereof. The ceramic and/or graphene heat dissipation layer 10132 is a single ceramic heat dissipation material, a single graphene heat dissipation material, or a ceramic and graphene mixed heat dissipation material, which can be laminated onto the surface of the conductive foil 10131. The thickness of the ceramic and/or graphene heat dissipation layer 10132 is 20 nanometers~150 millimeters. A coating, printing, spraying, vapor deposition, or sputter coating method is used to cover the surfaces of the thin electrically conductive functional layer 1013 with the first thermal conductive adhesive layer 1011 and the second thermal conductive adhesive layer 1012.

Figure 6:
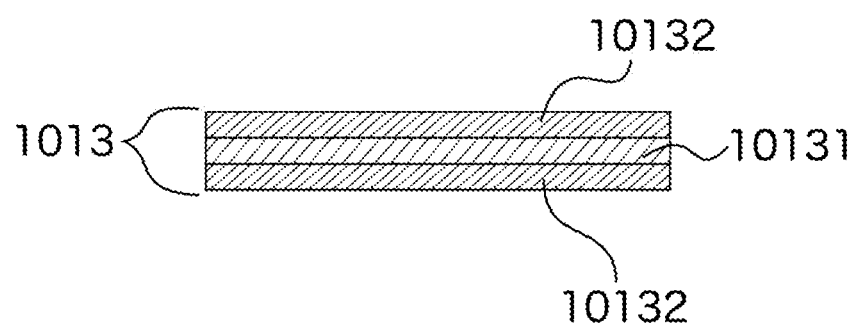
FIG. 6 shows a structural view of an embodiment 3 of a thin electrically conductive functional layer of the thermal interface materials for the interior, center, and exterior of an electronic component according to the present invention.

FIG. 6 shows a structural view of an embodiment 3 of a thin electrically conductive functional layer of the thermal interface materials for the interior, center, and exterior of an electronic component according to the present invention, wherein the thin electrically conductive functional layer 1013 is the conductive foil 10131 provided with the ceramic and/or graphene heat dissipation layer 10132 on two sides thereof. A coating, printing, spraying, vapor deposition, or sputter coating method is used to cover the surfaces of the conductive foil 10131 with the ceramic and/or graphene heat dissipation layer 10132.

Figure 7:
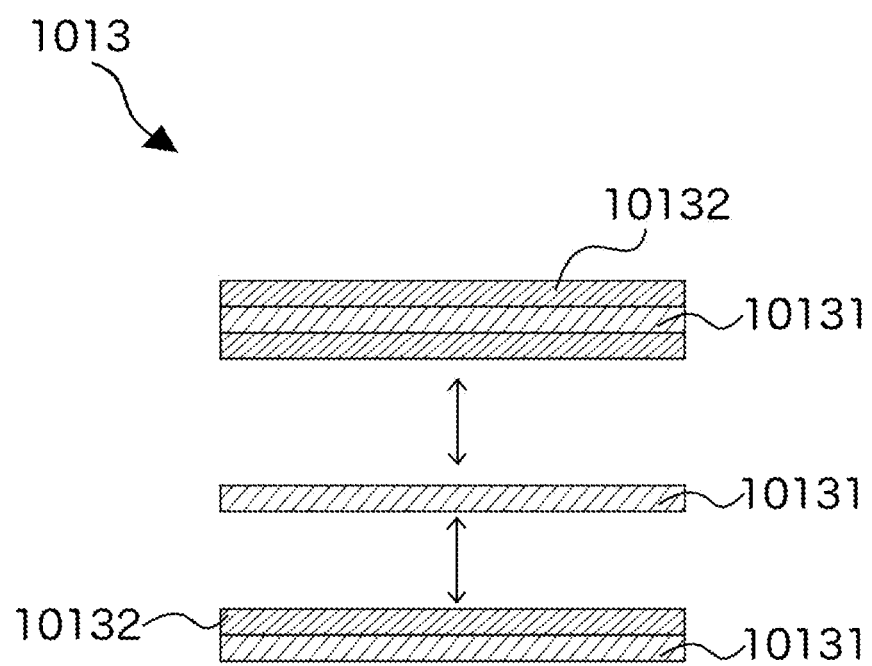
FIG. 7 shows a schematic view depicting laminated processing of the thin electrically conductive functional layers of the thermal interface materials for the interior, center, and exterior of an electronic component according to the present invention.

FIG. 7 shows a schematic view depicting laminated processing of the thin electrically conductive functional layers of the thermal interface materials for the interior, center, and exterior of an electronic component according to the present invention. As a more detailed description, the thin electrically conductive functional layer 1013 of the present invention is at least the conductive foil 10131, the conductive foil 10131 provided with the ceramic and/or graphene heat dissipation layer 10132 on one side thereof, and the conductive foil 10131 provided with the ceramic and/or graphene heat dissipation layer 10132 on two sides thereof, which can be assembled in a laminated configuration to increase the heat and electric conduction effect and further enhance the electromagnetic wave protection effect, thereby reinforcing the stability in use of the electronic chip 301. The thin electrically conductive functional layer 1013 is finally sandwiched between the first thermal conductive adhesive layer 1011 and the second thermal conductive adhesive layer 1012, and then bonded to the surfaces of the electronic chip 301, the integrated heat spreader 501, and the heatsink 701, to functionally improve thermal conductivity and avoid current overflow and short-circuit.

The present invention provides thermal interface materials for the interior, center, and exterior of an electronic component, wherein the interior of the electronic component is a first contact interface between the electronic chip 301 and the integrated heat spreader 501; the center of the electronic component is a second contact interface between the electronic chip 301 and the heatsink 701; and the exterior of the electronic component is a third contact interface between the integrated heat spreader 501 and the heatsink 701. The thermal interface materials at the first, second, and third contact interfaces are abbreviated to the TIM1 101, TIM1.5 103, and the TIM2 102, respectively, according to the interior, center, and exterior application positions thereof. The thermal interface materials comprise: the first thermal conductive adhesive layer 1011, the thickness of which lies between 0.1 micrometers~300 micrometers, and has a voltage resistance of 100~20 KV; the second thermal conductive adhesive layer 1012, the thickness of which lies between 0.1 micrometers~300 micrometers, and has a voltage resistance of 100~20 KV; and the thin electrically conductive functional layer 1013. The thin electrically conductive functional layer 1013 is at least the conductive foil 10131, the conductive foil 10131 provided with the ceramic and/or graphene heat dissipation layer 10132 on one side thereof, and the conductive foil 10131 provided with the ceramic and/or graphene heat dissipation layer 10132 on two sides thereof, which is sandwiched between the first thermal conductive adhesive layer 1011 and the second thermal conductive adhesive layer 1012, and has a voltage resistance of 500~20 KV. The thin electrically conductive functional layer 1013 is at least a copper foil, an aluminum foil, silver paste, carbon nanotubes, electrically conductive macromolecules, tin paste, electrically conductive ink, or copper paste. The thickness of the conductive foil 10131 is 100 nanometers~50 millimeters, and the thickness of the ceramic and/or graphene heat dissipation layer 10132 is 20 nanometers~150 millimeters. The present invention is provided with the advantages of an immobile solid state bonded material that is easily worked and reworked, and has processing properties appropriate for roll bonding, low pressure bonding, high-pressure bonding, and low pressure air extraction laminating. The good air extraction properties of the first thermal conductive adhesive layer 1011 and the second thermal conductive adhesive layer 1012 reduces the presence of poor conductive air between the interfaces. Moreover, the voltage resistance, high electric conduction, and high thermal conductivity of the present invention are all distinct from the prior art and thus distinguishes itself therefrom. Further, its originality, advancement, and practical effectiveness are unmistakable, and the materials and structural characteristics of the present invention differentiates it from the prior art, providing unmistakable practical effectiveness that enables significant improvements on the shortcomings of the prior art.

In conclusion, the concrete structures of the embodiments disclosed in the present invention certainly enable providing good reworking properties, no leaking of silicone oil, long operating life, tolerance to high temperature, and no current overflow or short circuit under a high wattage environment. In addition, there is no need for it to be enclosed, which makes it appropriate for application in a variety of usage environments. Further, the overall structure of the present invention has not been seen in like products; moreover, the contents of this specification have not been publicly disclosed prior to this application, clearly complying with the essential elements as required for a new patent. Accordingly, a patent application is proposed herein.

It is of course to be understood that the embodiments described herein are merely illustrative of the principles of the invention and that a wide variety of modifications thereto may be effected by persons skilled in the art without departing from the spirit and scope of the invention as set forth in the following claims.

What is claimed is:

1. Thermal interface materials (TIM) for an interior and an exterior of an electronic component, comprising:
    a first contact interface between an electronic chip and an integrated heat spreader (IHS) for the interior of the electronic component; and
    a second contact interface
    between the integrated heat spreader and a heatsink for the exterior of the electronic component; the first contact interface and the second contact interface are thermal interface materials mounted to the interior and the exterior of the electronic component to which are abbreviated to TIM1 and TIM2, respectively, wherein the thermal interface materials further comprising:
    a first thermal conductive adhesive layer, a thickness of which lies between 0.1 micrometers ~300 micrometers, and has a voltage resistance of 100V~20 KV;
    a second thermal conductive adhesive layer, a thickness of which lies between 0.1 micrometers ~300 micrometers, and has a voltage resistance of 100V~20 KV; and
    a thin electrically conductive functional layer, which is at least a conductive foil, a conductive foil provided with a ceramic and/or graphene heat dissipation layer on one side thereof, and a conductive foil provided with a ceramic and/or graphene heat dissipation layer on two sides thereof; the thin electrically conductive functional layer is sandwiched between the first thermal conductive adhesive layer and the second thermal conductive adhesive layer, and has a voltage resistance of 500V~20 KV;
    wherein the conductive foil of the thin electrically conductive functional layer is at least a copper foil, an aluminum foil, silver paste, carbon nanotubes, electrically conductive macromolecules, tin paste, electrically conductive ink, or copper paste; the thickness of the conductive foil is 100 nanometers~50 millimeters, and the thickness of the ceramic and/or graphene heat dissipation layer is 20 nanometers~150 millimeters.

2. The thermal interface materials for the interior, center, and exterior of an electronic component according to claim 1, wherein a coating, printing, spraying, vapor deposition, or sputter coating method is used to cover the surfaces of the thin electrically conductive functional layer with the first thermal conductive adhesive layer and the second thermal conductive adhesive layer.

3. The thermal interface materials for the interior, center, and exterior of an electronic component according to claim 1, wherein the first thermal conductive adhesive layer and the second thermal conductive adhesive layer are bonded onto the surfaces of the thin electrically conductive functional layer.

4. The thermal interface materials for the interior, center, and exterior of an electronic component according to claim 1, wherein the average thermal conductivity K-value of the first thermal conductive adhesive layer and the second thermal conductive adhesive layer is between 30~150 W/mK, and the thermal diffusivity is between 10~130 mm$^2$/s.

5. The thermal interface materials for the interior, center, and exterior of an electronic component according to claim 1, wherein a coating, printing, spraying, vapor deposition, or sputter coating method is used to cover the surfaces of the conductive foil with the ceramic and/or graphene heat dissipation layer.

6. The thermal interface materials for the interior, center, and exterior of an electronic component according to claim 1, wherein 0.3~3 Kg/cm$^2$ low pressure bonding, 100~3 Kg/cm$^2$ high-pressure bonding, less than 0.1 mbar negative pressure and under 0.1~1 Kg/cm$^2$ pressure, vacuum lamination, or a mixed roll/press bonding processing method is used to bond the TIM1 to the first contact interface between an electronic chip and the integrated heat spreader, with the TIM1 being at a temperature between −60~360° C.

7. The thermal interface materials for the interior, center, and exterior of an electronic component according to claim 1, wherein the first thermal conductive adhesive layer and the second thermal conductive adhesive layer of the TIM1.5 are sliding materials containing a lubricating oil and a hot melt adhesive.

8. The thermal interface materials for the interior, center, and exterior of an electronic component according to claim 1, wherein the first thermal conductive adhesive layer and the second thermal conductive adhesive layer of the TIM2 are sliding materials containing a lubricating oil and a hot melt adhesive.

9. The thermal interface materials for the interior, center, and exterior of an electronic component according to claim 1, wherein 0.3~3 Kg/cm$^2$ low pressure bonding, or a mixed roll/press bonding processing method is used to bond the TIM2 to the third contact interface between the integrated heat spreader and the heatsink, with the TIM2 being at a temperature between −60~360° C.

* * * * *